US010529418B2

(12) United States Patent
Hu et al.

(10) Patent No.: US 10,529,418 B2
(45) Date of Patent: Jan. 7, 2020

(54) LINEAR TRANSFORMATION ACCELERATORS

(71) Applicant: Hewlett Packard Enterprise Development LP, Houston, TX (US)

(72) Inventors: Miao Hu, Palo Alto, CA (US); John Paul Strachan, Palo Alto, CA (US); Zhiyong Li, Foster City, CA (US); R. Stanley Williams, Portola Valley, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/079,998

(22) PCT Filed: Feb. 19, 2016

(86) PCT No.: PCT/US2016/018567
§ 371 (c)(1),
(2) Date: Aug. 25, 2018

(87) PCT Pub. No.: WO2017/142542
PCT Pub. Date: Aug. 24, 2017

(65) Prior Publication Data
US 2019/0066780 A1    Feb. 28, 2019

(51) Int. Cl.
*G11C 13/00* (2006.01)
*G11C 11/56* (2006.01)

(52) U.S. Cl.
CPC .......... *G11C 13/0028* (2013.01); *G11C 11/56* (2013.01); *G11C 13/0026* (2013.01); *G11C 2213/77* (2013.01)

(58) Field of Classification Search
None
See application file for complete search history.

(56) References Cited

U.S. PATENT DOCUMENTS

| 10,042,819 B2 * | 8/2018 | Hu .......................... G06F 17/14 |
| 2006/0268598 A1 | 11/2006 | Snider |
| 2012/0109866 A1 | 5/2012 | Modha |
| 2013/0010550 A1 * | 1/2013 | Kim .......................... G11C 7/02 365/189.15 |

(Continued)

OTHER PUBLICATIONS

Choi, S. et al., "Data Clustering Using Memristor Networks", (Research Paper), http://www.nature.com/articles/srep10492, May 28, 2015, 10 pages.

(Continued)

*Primary Examiner* — Tan T. Nguyen
(74) *Attorney, Agent, or Firm* — Hewlett Packard Enterprise Patent Department (57) ABSTRACT

Examples herein relate to linear transformation accelerators. An example linear transformation accelerator may include a crossbar array programmed to calculate a linear transformation. The crossbar array has a plurality of words lines, a plurality of bit lines, and a memory cell coupled between each unique combination of one word line and one bit line, where the memory cells are programmed according to a linear transformation matrix. The plurality of word lines are to receive an input vector, and the plurality of bit lines are to output an output vector representing a linear transformation of the input vector.

12 Claims, 7 Drawing Sheets

(56) References Cited

U.S. PATENT DOCUMENTS

| | | | |
|---|---|---|---|
| 2013/0028004 A1 | 1/2013 | Snider | |
| 2014/0172937 A1 | 6/2014 | Linderman et al. | |
| 2014/0268994 A1 | 9/2014 | Rose et al. | |
| 2014/0324742 A1 | 10/2014 | Eshghi | |
| 2015/0213884 A1* | 7/2015 | Taha | G11C 13/004 365/148 |
| 2015/0347896 A1 | 12/2015 | Roy et al. | |
| 2016/0343432 A1* | 11/2016 | Henze | H01L 45/04 |
| 2018/0095722 A1* | 4/2018 | Buchanan | G06F 7/523 |
| 2018/0114569 A1* | 4/2018 | Strachan | G11C 7/1012 |
| 2018/0277760 A1* | 9/2018 | Krakovinsky | H01L 45/146 |

OTHER PUBLICATIONS

Gao, L. et al., "Analog-Input Analog-Weight Dot-Product Operation With Ag/a-Si/Pt Memristive Devices", (Research Paper). https://www.ece.ucsb.edu/~strukov/papers/2012/VLSISOCdp2012.pdf, Oct. 7, 2012, 6 pages.

International Searching Authority, The International Search Report and the Written Opinion, PCT/US2016/018567, dated Nov. 14, 2016, 10 Pgs.

* cited by examiner

LINEAR TRANSFORMATION ACCELERATORS

STATEMENT OF GOVERNMENT INTEREST

This invention has been made with government support under Contract 2014-14080800008 award by the IARPA Dot Product Engine Project. The government has certain rights in the invention.

BACKGROUND

Memristors are devices that can be programmed to different resistive states by applying a programming energy, such as a voltage. Large crossbar arrays of memory devices with memristors can be used in a variety of applications, including memory, programmable logic, signal processing control systems, pattern recognition, and other applications.

Linear transformations are a category of functions applied in several computer operations. Linear maps can be represented by matrices, and examples include rotation and reflection linear transformations.

BRIEF DESCRIPTION OF THE DRAWINGS

The following detailed description references the drawings, wherein.

DETAILED DESCRIPTION

Linear transformations are mathematical functions used in various computer applications, including in data, image, sound, and video processing. In many circumstances, a linear transformation may be represented as a vector-matrix transformation operation, where a vector of values is multiplied by a linear transformation matrix to produce a second vector of values. However, linear transformations may be very computation-intensive, and may be too resource-hungry to be optimally implemented with a general processor.

Memristors are devices that may be used as components in a wide range of electronic circuits, such as memories, switches, radio frequency circuits, and logic circuits and systems. In a memory structure, a crossbar array of memory devices having memristors may be used. When used as a basis for memory devices, memristors may be used to store bits of information, 1 or 0. The resistance of a memristor may be changed by applying an electrical stimulus, such as a voltage or a current, through the memristor. Generally, at least one channel may be formed that is capable of being switched between two states—one in which the channel forms an electrically conductive path ("on") and one in which the channel forms a less conductive path ("off"). In some other cases, conductive paths represent "off" and less conductive paths represent "on".

In some applications, a memory crossbar array can be used to perform vector-matrix computations. For example, an input voltage signal from each word line of the crossbar is weighted by the conductance of the resistive devices in each bit line and accumulated as the current output from each bit line. Ideally, if wire resistances can be ignored, the current, I, flowing out of the crossbar array will be approximately $I^T=V^TG$, where V is the input voltage and G is the conductance matrix, including contributions from each memristor in the crossbar array. The use of memristors at junctions or cross-point of the crossbar array enables programming the resistance (or conductance) at each such junction.

Examples disclosed herein provide for hardware implementation of linear transformation accelerators. Example linear transformation accelerators may include a crossbar array programmed to calculate a linear transformation. Memory cells of the crossbar array may be programmed according to a linear transformation matrix. Driving electrical signals mapped from an input vector through the crossbar array may produce an output vector representing a linear transformation of the input vector. In this manner, linear transformation accelerators herein provide for hardware calculations of linear transformation operations.

Figure 1:
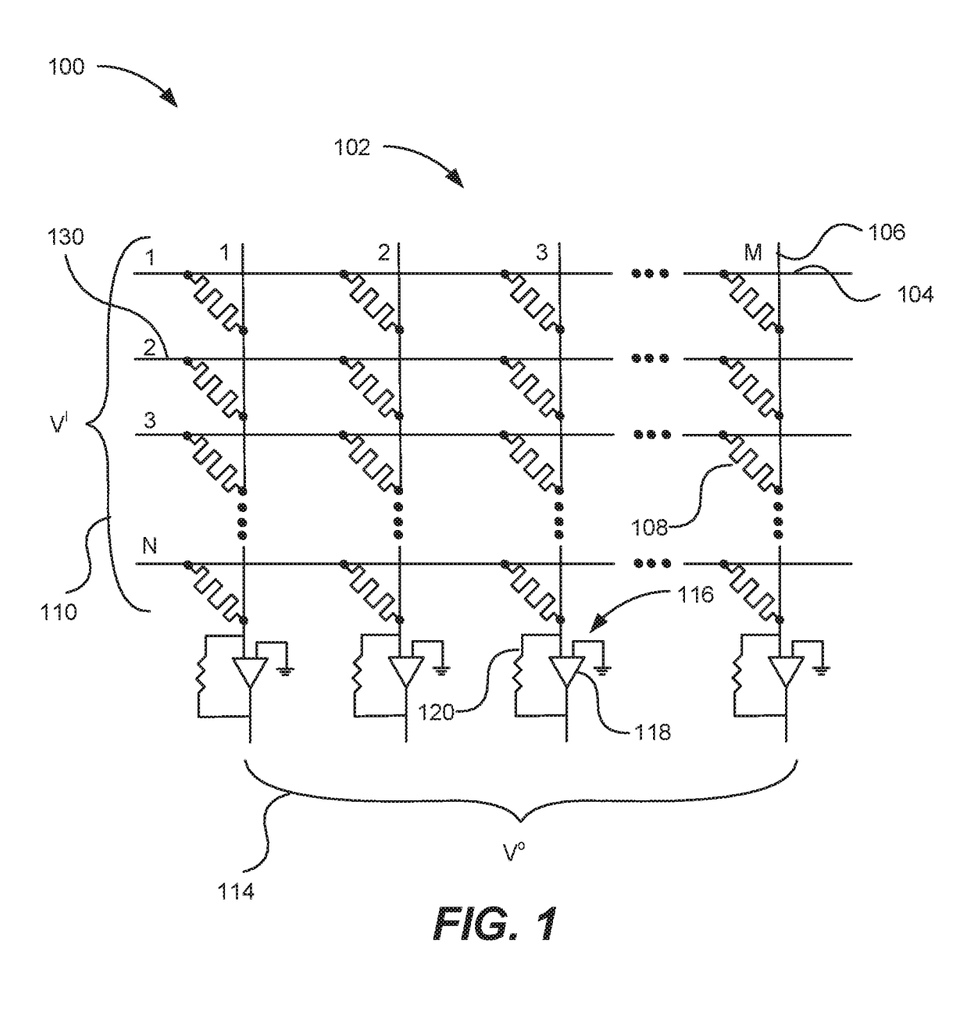
FIG. 1 is a diagram of an example linear transformation accelerator.

Referring now to the drawings, FIG. 1 illustrates an example linear transformation accelerator 100. Linear transformation accelerator 100 may be a hardware unit that calculates a linear transformation operation. Linear transformation accelerator 100 may calculate a linear transformation of an input vector in relation to a linear transformation matrix. Linear transformation accelerator 100 may do so by calculating a vector-matrix multiplication of the input vector with the linear transformation matrix.

Linear transformation accelerator 100 may be implemented as a crossbar array 102. Crossbar array 102 may be a configuration of parallel and perpendicular lines with memory cells coupled between lines at intersections. Crossbar array 102 may include a plurality of word lines 104, a plurality of bit lines 106, and a plurality of memory cells 108. A memory cell 108 may be coupled between each unique combination of one word line 104 and one bit line 106. In other words, no memory cell 108 shares both a word line and a bit line.

Word lines 104 may be electrodes that carry current through crossbar array 100. In some examples, word lines 104 may be parallel to each other, generally with equal spacing. Word lines 104 may sometimes be, for example, a top or row electrode. Similarly, bit lines 106 may be electrodes that run nonparallel to word lines 104. Bit lines 106 may sometimes be, for example, a bottom or column electrode. Word lines 104 and bit lines 106 may serve as electrodes that deliver voltage and current to the memory cells 108. Example materials for word lines 104 and bit lines 106 may include conducting materials such as Pt, Ta, Hf, Zr, Al, Co, Ni, Fe, Nb, Mo, W, Cu, Ti, TiN, TaN, $Ta_2N$, $WN_2$, NbN, MoN, $TiSi_2$, TiSi, $Ti_5Si_3$, $TaSi_2$, $WSi_2$, $NbSi_2$, $V_3Si$, electrically doped polycrystalline Si, electrically doped polycrystalline Ge, and combinations thereof. In the example of FIG. 1, crossbar array 102 may have N word lines and M bit lines.

Memory cells 108 may be coupled between world lines 104 and bit lines 106 at intersections of the word lines 104 and bit lines 106. For example, memory cells 108 may be positioned to calculate a linear transformation of an input vector with respect to a linear transformation matrix. Each memory cell 108 may have a memory device such as a resistive memory element, a capacitive memory element, or some other form of memory.

In some examples, each memory cell 108 may include a resistive memory element. A resistive memory element may have a resistance that changes with an applied voltage or current. Furthermore, in some examples, the resistive memory element may "memorize" its last resistance. In this manner, each resistive memory element may be set to at least two states. In many examples, a resistive memory element may be set to multiple resistance states, which may facilitate various analog operations. The resistive memory element may accomplish these properties by having a memristor, which may be a two-terminal electrical component that provides memristive properties as described herein.

In some examples, a memristor may be nitride-based, meaning that at least a portion of the memristor is formed from a nitride-containing composition. A memristor may also be oxide-based, meaning that at least a portion of the memristor is formed from an oxide-containing material. Furthermore, a memristor may be oxy-nitride based, meaning that at least a portion of the memristor is formed from an oxide-containing material and that at least a portion of the memristor is formed from a nitride-containing material. Example materials of memristors may include tantalum oxide, hafnium oxide, titanium oxide, yttrium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, silicon nitride, and oxynitrides such as silicon oxynitride. In addition, other functioning memristors may be employed in the practice of the teachings herein.

A memristor may exhibit nonlinear or linear current-voltage behavior. Nonlinear may describe a function that grows differently than a linear function. In some implementations, a memristor may be linear or nonlinear in voltage ranges of interest. A voltage range of interest may be, for example, a range of voltages used in the operation of linear transformation accelerator 100.

In some examples, memory cell 108 may include other components, such as access transistors or selectors. For example, each memory cell 108 may be coupled to an access selector between the intersections of a word line 104 and a bit line 106. Access selectors may facilitate the targeting of individual or groups of memory cells 108 for the purposes of reading or writing the memory cells.

Alternatively, a selector may be an electrical device that may be used in memristor devices to provide desirable electrical properties. For example, a selector may be a 2-terminal device or circuit element that admits a current that depends on the voltage applied across the terminals. A selector may be coupled to each memory cell 108 to facilitate the targeting of individual or groups of memory cells 108. For example, a selector may do so by acting like an on-off switch, and it may mitigate sneak current disturbance.

The memory cells 108 of crossbar array 102 may be programmed according to a linear transformation matrix. The linear transformation matrix may represent any linear transformation operation, including but not limited to discrete Fourier transformation, discrete cosine transformation, rotation transformation, reflection transformation, scaling transformation, affine transformation, weight matrices, and convolution. The value stored in the memory cells 108 may represent the values of the linear transformation matrix. In implementations of resistive memory, the resistance levels of each memory cell 102 may represent a value of the matrix. In such a manner, the linear transformation matrix may be mapped onto crossbar array 102.

Memory cells 108 may be programmed, for example, by having programming signals driven through them, which drives a change in the state of the memory cells 108. The programming signals may define a number of values to be applied to the memory cells. As described herein, the values of memory cells 108 of crossbar array 102 may represent a linear transformation matrix. For example, the linear transformation operation that linear transformation accelerator 100 may calculate may be useful for various data handling procedures, including processing of images, sounds, and videos.

Continuing to refer to FIG. 1, linear transformation accelerator 100 may receive an input vector at the plurality of word lines 104. The input vector may be converted to input electrical signals 110 by a drive circuit, which is described in further detail with relation to FIG. 2. The input electrical signals 110 may be, for example, an electrical current driven to the memory cells 108. However, the input electrical signals 110 may be, for example, voltage, an energy, or other form of electrical stimulus. Upon passing through the crossbar array 102, the plurality of bit lines 106 may deliver output electrical signals 114, where the output electrical signals 114 may be mapped to an output vector that represents a linear transformation of the input vector. Furthermore, linear transformation accelerator 100 may also include read circuitry 116 for converting the output electrical signals 114, which may be analog values, to the output vector, which may have digital values. In an example of the principles described herein, read circuitry 116 may include an operational amplifier 118 and a resistor 120, which can be arranged to represent a virtual ground for read operations.

Linear transformation accelerator 100 may also include other peripheral circuitry associated with crossbar array 102. For example, an address decoder may be used to select a word line 104 and activate a drive circuit corresponding to the selected word line 104. The drive circuit for a selected word line 104 can drive a corresponding word line 104 with different voltages corresponding to a linear transformation or the process of setting resistance values within memory cells 108 of crossbar array 102. Similar drive and decode circuitry may be included for bit lines 106. Control circuitry may also be used to control application of voltages at the inputs and reading of voltages at the outputs of linear transformation accelerator 100. Digital to analog circuitry and analog to digital circuitry may be used for input electrical signals 110 and output electrical signals 114. In some examples, the peripheral circuitry above described can be fabricated using semiconductor processing techniques in the same integrated structure or semiconductor die as crossbar array.

As described herein, there are two main operations that occur during operation of the linear transformation accelerator 100. The first operation is to program the memory cells 108 in the crossbar array 102 so as to map the mathematic values in an N×M matrix to the array. In some examples, one memory cell 108 is programmed at a time during the programming operation. The second operation is the linear transformation calculation by vector-matrix multiplication. In this operation, input voltages are applied and output voltages obtained, corresponding to the result of multiplying an N×M, matrix by an $Nx_1$ vector. In some examples, the input voltages are below the programming voltages so the resistance values of the memory cells 108, such as resistive memory, are not changed during the linear transformation calculation In an example, linear transformation calculator 100 may calculate a linear transformation by applying a set of voltages $V^I$ 110 simultaneously along word lines 104 of the N×M crossbar array 102 and collecting the currents through bit lines 106 and measuring output voltage $V^O$ 114. On each bit line 106, every input voltage 110 is weighted by the corresponding memristance ($1/G_{ij}$) and the weighted summation is reflected at the output voltage 114. Using Ohm's law, the relation between the input voltages 110 and output voltages 114 can be represented by a vector-matrix multiplication of the form: $\{V^O\}^T=\{V^I\}^T [G] R_S$, where $G_{ij}$ is an N×M matrix determined by the conductance (inverse of resistance) of crossbar array 102, $R_S$ is the resistance value of the sense amplifiers and T denotes the transpose of the column vectors $V^O$ and $V^I$. The negative sign follows from use of a negative feedback operational amplifier in the sense amplifiers. From the foregoing, it follows that the linear transformation accelerator 100 can be utilized for multiplying a first vector of values $\{b_i\}^T$ by a matrix of values $[a_{ij}]$ to obtain a second vector of values $\{c^j\}$, where i=1,N and j=1,M. The vector operation can be set forth in more detail as follows.

$$a_{11}b_1+a_{211}b_2+ \ldots +a_{N1}b_N=c_1$$

$$a_{1M}b_1+a_{2M}b_2+ \ldots +a_{NM}b_N=c_M.$$

The vector processing or multiplication using the principles described herein generally starts by mapping a matrix of values $[a_{ij}]$ onto crossbar array 102 or, stated otherwise, programming—e.g., writing—conductance values $G_{ij}$ into the crossbar junctions of the crossbar array 102.

With reference still to FIG. 1, in some examples, each of the conductance values $G_{ij}$ is set by sequentially imposing a voltage drop over each of the memory cells 108. For example, the conductance value $G_{2,3}$ may be set by applying a voltage equal to $V_{Row2}$ at the $2^{nd}$ word line 104 of crossbar array 102 and a voltage equal to $V_{Col3}$ at the ad bit line 106 of the array. The voltage input, $V_{Row2}$, may be applied to the $2^{nd}$ word line at a location 130 occurring at the $2^{nd}$ word line adjacent the j=1 bit line. The voltage input, $V_{Col3}$, will be applied to the $3^{rd}$ bit line adjacent either the i=1 or i=N location. Note that when applying a voltage at a bit line 106, the sense circuitry 116 for that bit line may be switched out and a voltage driver switched in. The voltage difference $V_{Row2}-V_{Col3}$ will generally determine the resulting conductance value $G_{2,3}$ based on the characteristics of the memory cell 108 located at the intersection. When following this approach, the unselected bit lines 106 and word lines 104 may be addressed according to one of several schemes, including, for example, floating all unselected bit lines 106 and word lines 104 or grounding all unselected bit lines and column lines. Other schemes involve grounding bit lines 106 or grounding partial bit lines 106. Grounding all unselected bit lines and word lines is beneficial in that the scheme helps to isolate the unselected bit lines and word lines to minimize the sneak path currents to the selected bit line 106. Following programming, operation of linear transformation accelerator 100 proceeds by applying the input voltages 110 and reading the output voltages 114.

In accordance examples herein, memristors used in memory cells 108 may have linear current-voltage relation. Linear current-voltage relations permit higher accuracy in the matrix multiplication process. However, crossbar arrays 102 having linear memristors are prone to having large sneak path currents during programming of the array 102, particularly when the size of crossbar array 102 is larger than a certain size, for instance, 32×32. In such cases, the current running through a selected memristor may not be sufficient to program the memristor because most of the current runs through the sneak paths. Alternatively, the memristor may be programmed at an inaccurate value because of the sneak paths.

To alleviate the sneak path currents in such instances, and especially when larger arrays are desired, an access device, such as an access transistor or a non-linear selector, may be incorporated within or utilized together with a memristor to minimize the sneak path currents in the array. More specifically, memory cell should be broadly interpreted to include memristive devices including, for example, a resistive memory element, a memristor, a memristor and transistor, or a memristor and other components.

Linear transformation accelerator 100 may be implemented as a hardware engine in a computing device. Example computing devices that include an example linear transformation accelerator may be, for example, a personal computer, a cloud server, a local area network server, a web server, a mainframe, a mobile computing device, a notebook or desktop computer, a smart TV, a point-of-sale device, a wearable device, any other suitable electronic device, or a combination of devices, such as ones connected by a cloud or Internet network, that perform the functions described herein.

Figure 2:
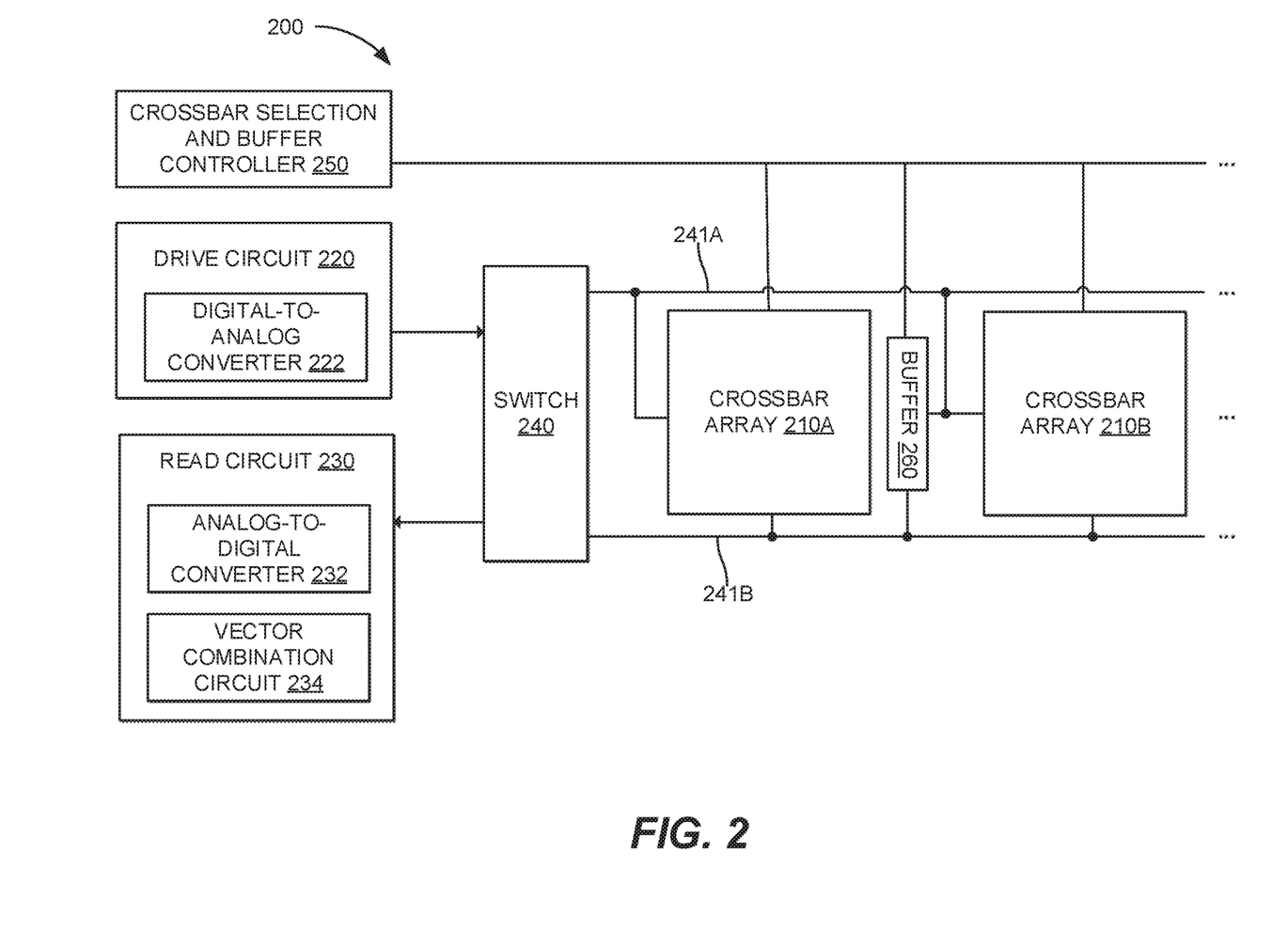
FIG. 2 is a diagram of a second example linear transformation accelerator having multiple crossbar arrays.

FIG. 2 is a schematic diagram of an example linear transformation accelerator 200 having multiple crossbar arrays. Similar to linear transformation accelerator 100 of FIG. 1, linear transformation accelerator 200 may be a hardware unit that calculates a linear transformation operation. Linear transformation accelerator 200 may calculate a linear transformation of an input vector in relation to a linear transformation matrix. Linear transformation accelerator 200 may do so by calculating a vector-matrix multiplication of the input vector with the linear transformation matrix. Linear transformation accelerator 200 may be utilized to calculate various linear transformation operations, examples of which are described herein with reference to FIGS. 4A, 4B, 5, 6, and 7.

Linear transformation accelerator 200 may have multiple crossbar arrays, illustrated here as crossbar array 210A and crossbar array 210B. However, it should be noted that linear transformation accelerator 200 is not limited to two crossbar arrays and may include any plurality of crossbar arrays as needed for particular operations. Crossbar arrays 210A and 210B may be controlled by crossbar selection and buffer controller 250, which may be a circuit connected to the crossbar arrays that may select which crossbar array is utilized for a particular operation. Buffers may be connected to the crossbar arrays to assist in the transfer of current to the selected crossbar array, as illustrated as buffer 260 connected to crossbar array 210B.

Crossbar arrays 210A and 210B may be programmed according to a linear transformation matrix. In some examples, each crossbar array 210A and 210B may be programmed to a different linear transformation matrix. Alternatively in other examples, the crossbar arrays 210A and 210B may be programmed to the same matrix. As described above, crossbar arrays 210A and 210B may be programmed by setting the states of their respective memory cells.

To calculate a linear transformation using linear transformation accelerator 200, an input vector may be received by drive circuit 220. The input vector may include the numerical values for which a linear transformation is to be calculated. Drive circuit 220 is to deliver a set of input electrical signals to the crossbar arrays that represents the input vector. In some examples, the input vector may include digital values, which may be converted to analog values of the input electrical signals by digital-to-analog converter 222. In other examples, the input vector may already include analog values.

The input electrical signals may be driven from drive circuit 220 to switch 240. Switch 240 may be a multiplexer, demultiplexer, or other circuitry to direct electrical signals. The switch 240 may control which set of lines of a crossbar array are to receive the input electrical signals. For example, switch 240 may direct the input electrical signals to the word lines of crossbar array, such as crossbar array 210A via the lines marked with 241A. Switch 240 may alternatively direct the input electrical signal to the bit lines of crossbar array 210A via the lines marked with 241B. For example, when the input electrical signals are directed to lines 241A, the other lines, here line 241B, may deliver the output electrical signals, and vice versa.

Upon passing through the crossbar arrays, the output electrical signals may be received by the switch 240. The switch 240 may then direct the output electrical signals onward to read circuit 230 or to the crossbar arrays for additional operations Upon being directed to the read circuit 230, the output electrical signals may be received by read circuit 230. The read circuit 230 may map the output electrical signals to an output vector with values representing the linear transformation of the input vector. In some examples, analog-to-digital converter 232 may convert the analog output electrical signals to digital values for the output vector.

Furthermore, vector combination circuit 234 may calculate a combination of the output electrical signals from multiple crossbar arrays, such as crossbar array 210A and 210B. Alternatively or in addition, vector combination circuit 234 may calculate a combination of the digital values of the output vectors after conversion by analog-to-digital converter 232. In such examples, analog-to-digital converter 232 may individually convert the output electrical signals of crossbar array 210A and crossbar array 210B to two output vectors, which are then combined by vector combination circuit 234.

Figure 3:
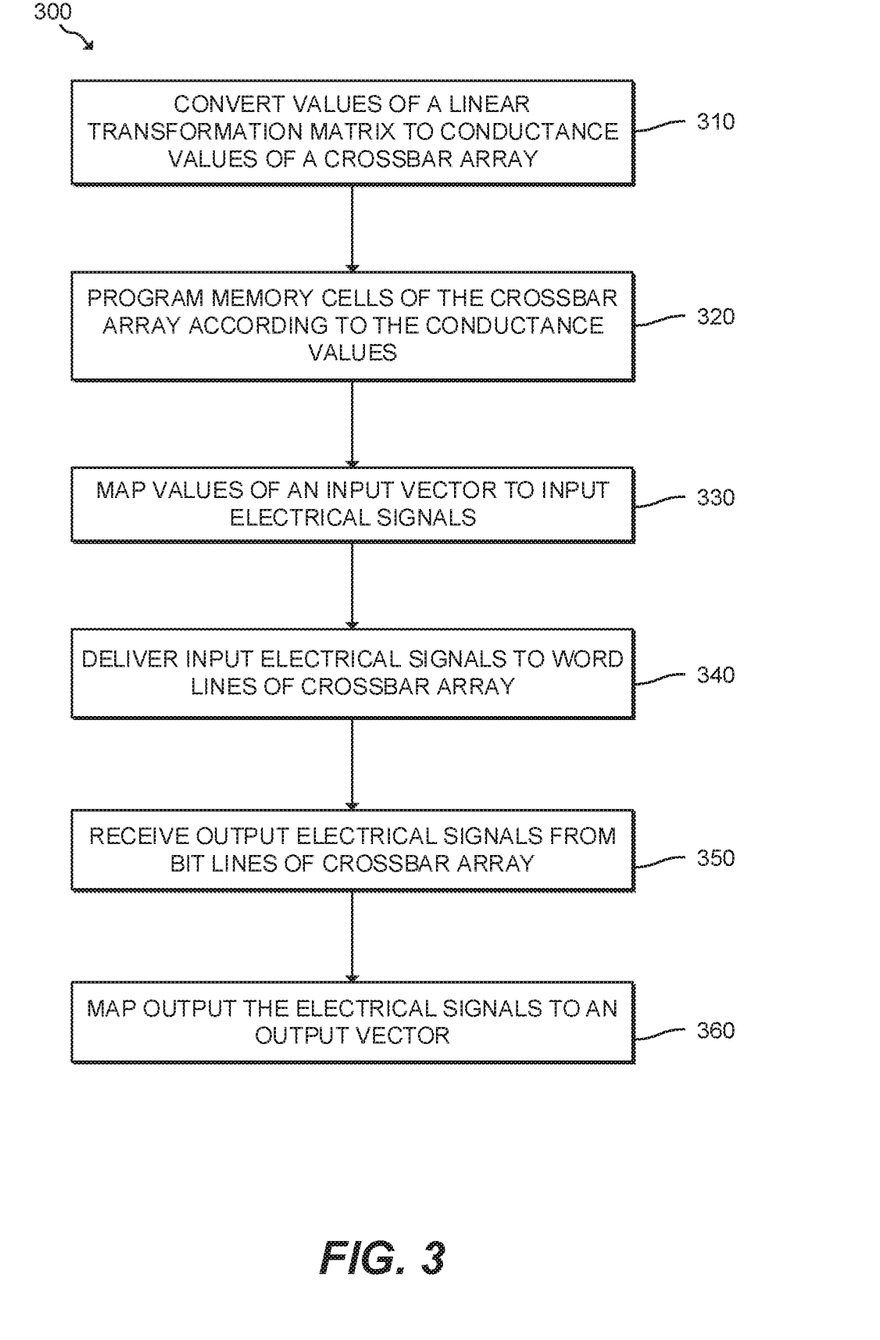
FIG. 3 is a flowchart of an example method for calculating a linear transformation.

FIG. 3 depicts a flowchart of an example method 300 for calculating a linear transformation with a linear transformation accelerator. Method 300 may include operation 310 for converting values of a linear transformation matrix to conductance values of a crossbar array, operation 320 for programming memory cells of the crossbar array according to the conductance values, operation 330 for mapping value of an input vector to input electrical signals, operation 340 for delivering the input electrical signals to word lines of the crossbar array, operation 350 for receiving output electrical signals from bit lines of the crossbar array, and operation 360 for mapping the output electrical signals to an output vector. Although execution of method 300 is herein described in reference to linear transformation accelerator 100 of FIG. 1, other suitable examples of method 300 should be apparent, including the examples provided in FIGS. 2 and 4-7.

In an operation 310, a linear transformation matrix may be converted to conductance values of crossbar array 102. The linear transformation matrix may represent any linear transformation operation. The value stored in the memory cells 108 of crossbar may represent the values of the linear transformation matrix. In implementations of resistive memory, the resistance levels of each memory cell 102 may represent a value of the matrix. In such a manner, the linear transformation matrix may be mapped onto crossbar array 102.

In an operation 320, the memory cells 108 of the crossbar array 102 may be programmed according to the conductance values converted in operation 310. As described previously, memory cells 108 may be programmed, for example, by having programming signals driven through them, which drives a change in the state of the memory cells 108.

In an operation 330, values of an input vector may be mapped to input electrical signals 110. For examples, numerical values of an input vector may be mapped into a plurality of electrical signal values to be delivered to the crossbar array. For example, the electrical signal values 110 may be current values or voltage values that drives a current to each memory cell 108 of crossbar array.

In an operation 340, the input electrical signals 110 are delivered to word lines 104 of crossbar array 102. In an operation 350 and upon the input electrical signals 110 passing through the crossbar array 102, output electrical signals 114 may be received from bit lines 106 of crossbar array 102.

In an operation 360, output electrical signals 114 may be mapped to an output vector that represents a linear transformation of the input vector.

FIG. 4-7 illustrate example linear transformation accelerators based on the teachings herein, where each example illustrates an example linear transformation operation. It should be noted that these figures only show a number of example implementations and the applications of linear transformation accelerators are not limited to the examples shown.

Figure 4A:
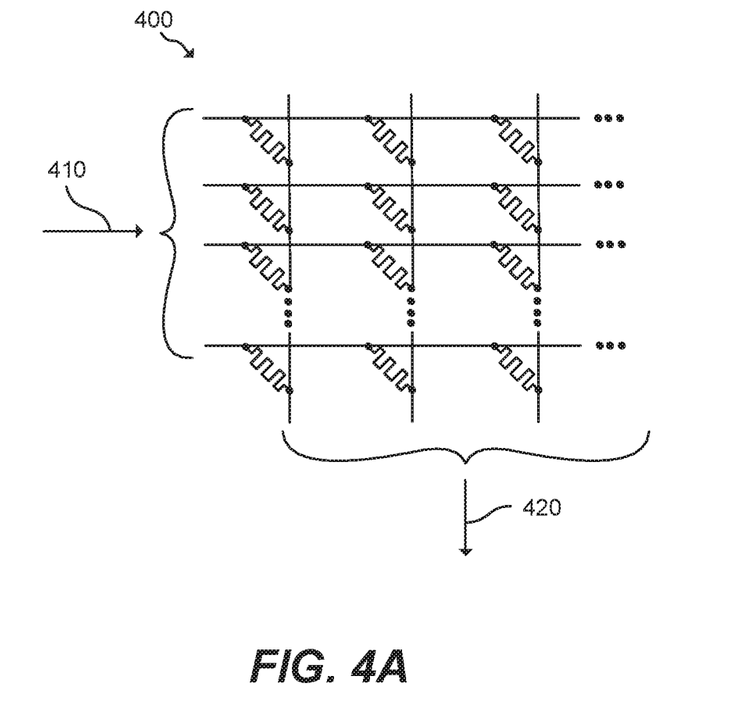
FIG. 4A is a schematic diagram of an example linear transformation operation.
Figure 4B:
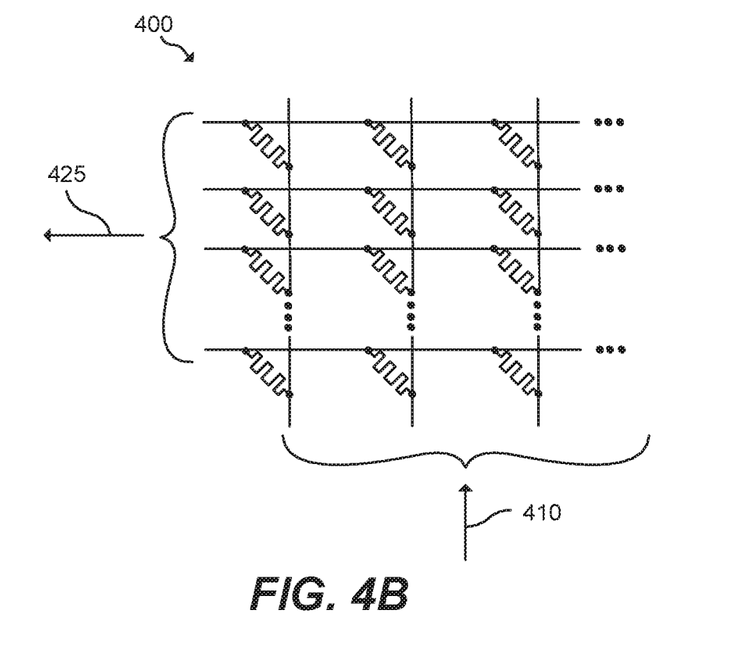
FIG. 4B is a schematic diagram of an example transpose linear transformation of the operation of FIG. 4A.

FIGS. 4A and 4B illustrate a linear transformation accelerator performing a linear transformation operation and a transpose of the linear transformation operation. For example, linear transformation accelerator 400 may receive an input vector 410 at the plurality of word lines and output an output vector 420 from the plurality of bit lines. If, however, an input vector 410 is input at the bit lines, the word lines may output an output vector 425 which may represent a transpose of the linear transformation operation performed when an input 410 is input at the word lines. Furthermore, if the crossbar array of linear transformation accelerator 400 is converted from an orthogonal matrix, driving the input vector 410 to the bit lines produces an inverse of the linear transformation operation performed when input vector 410 is driven to the word lines.

Figure 5:
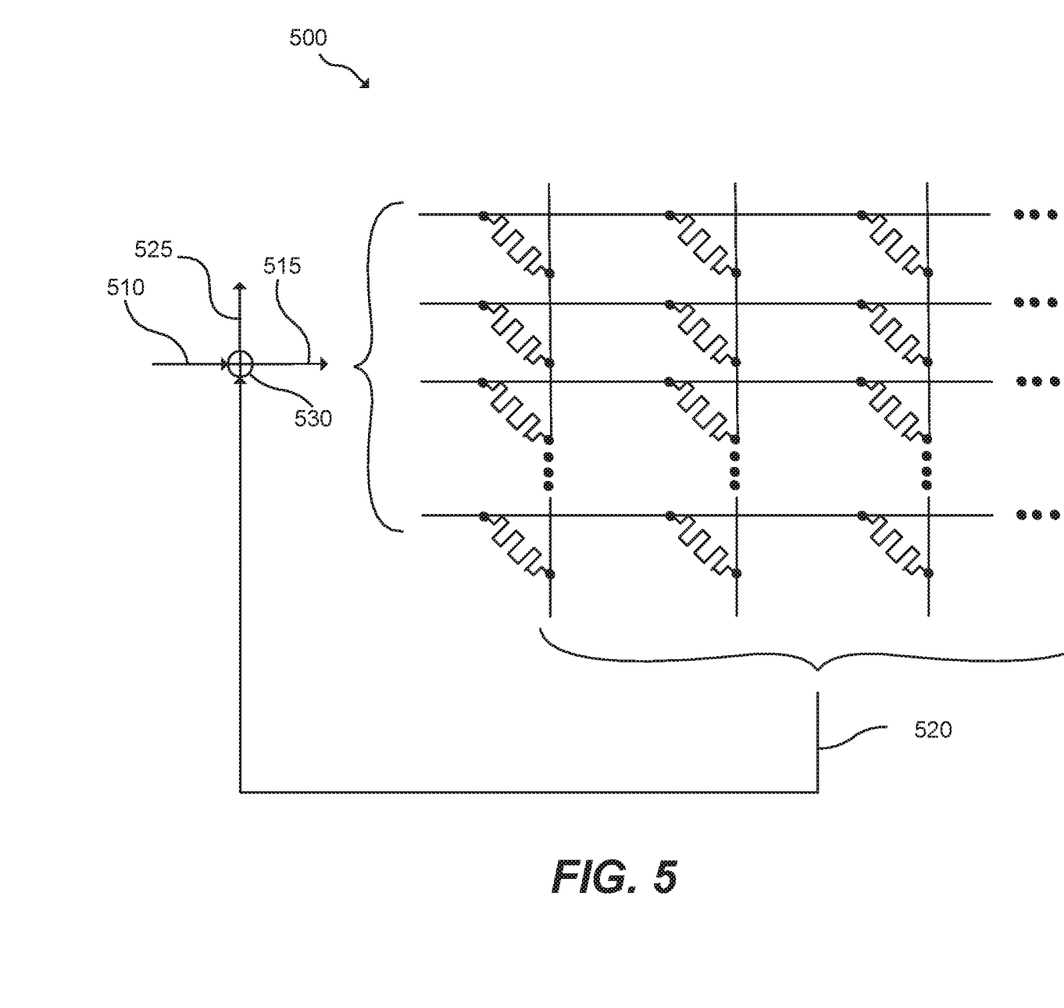
FIG. 5 is a schematic diagram of an example iterative linear transformation operation.

FIG. 5 illustrates a linear transformation accelerator 500 performing an iterative linear transformation operation. For example, an input vector 510 may be received by a counter 530, which may track the number of operations that have been calculated for the input vector. When that number of operations is below a threshold, the input vector is directed 515 to the crossbar array. The output vector 520 from received from the crossbar array is redirected back to the counter 530, which may determine when the output vector 520 is to be redirected back to the crossbar array for another iterative linear transformation operation. When the counter is complete or when an indication is received that the operation is complete, the final output vector 525 may be received from the counter.

Figure 6:
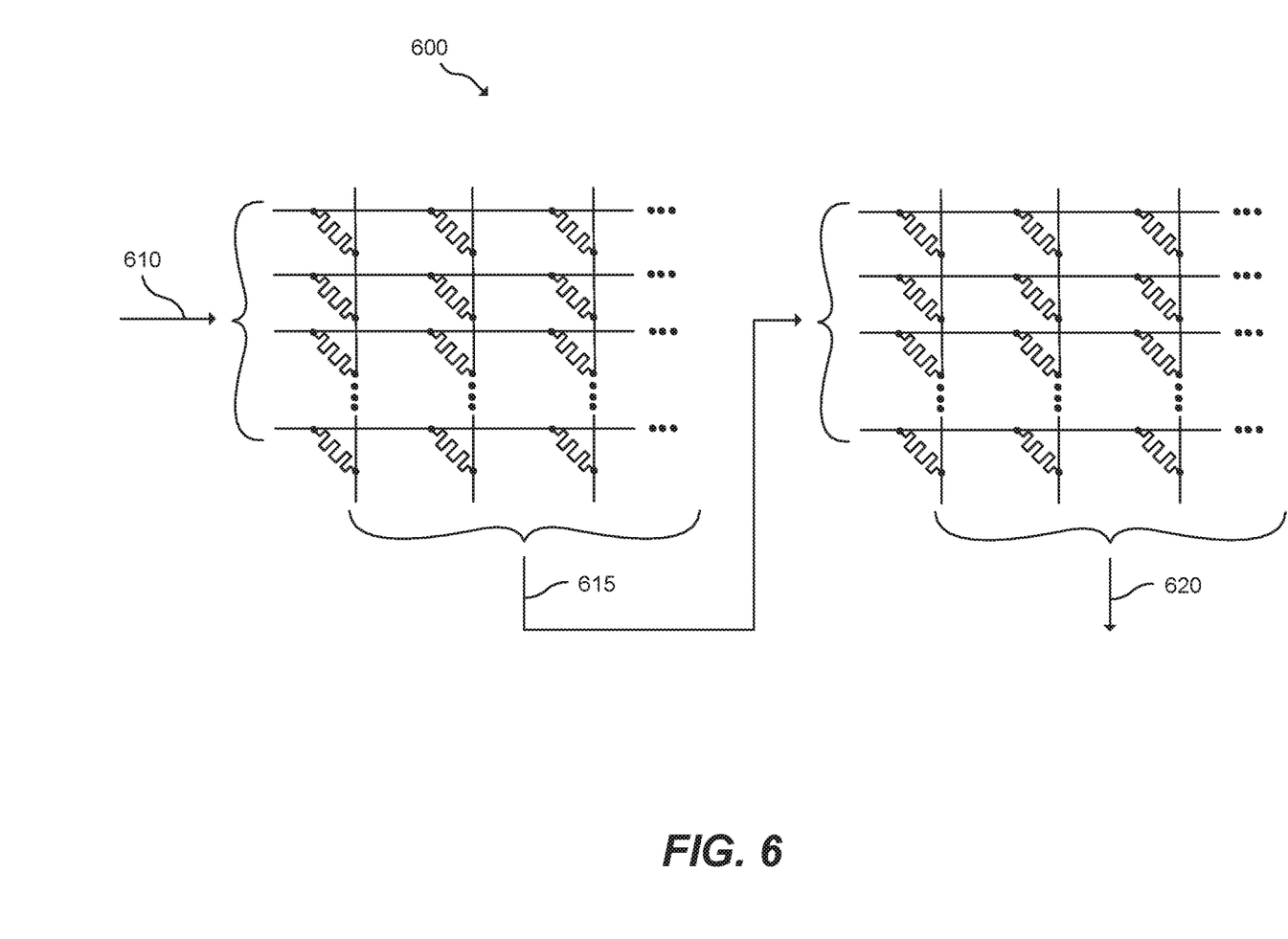
FIG. 6 is a schematic diagram of an example chain linear transformation.

FIG. 6 illustrates a linear transformation accelerator 600 performing a chain linear transformation operation. For example, an input vector 610 may be directed to a first crossbar array programmed according to a first linear transformation matrix. Upon output by the first crossbar array, an output vector 615 may be directed to a second crossbar array, which may be programmed according to a second linear transformation matrix. Final output vector 620 may represent a chain linear transformation of the original input vector 610.

Figure 7:
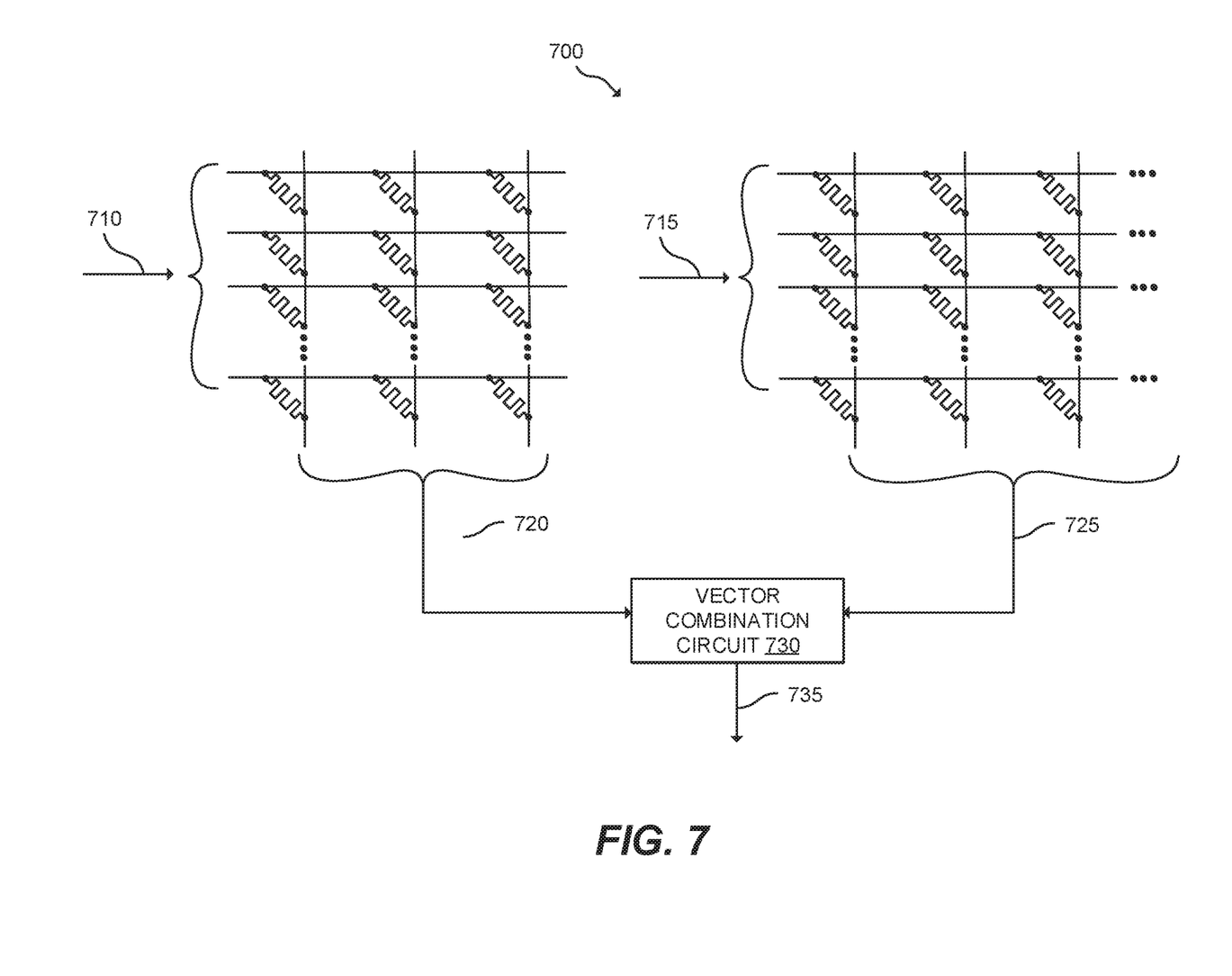
FIG. 7 is a schematic diagram of an example partition linear transformation.

FIG. 7. Illustrates a linear transformation accelerator 700 performing a combination linear transformation operation. For example, a first input vector 710 may be directed to a first crossbar array programmed according to a first linear transformation matrix. A second input vector 715 may be directed to a second crossbar array programmed according to a second linear transformation matrix. First output vector 720 and second output vector 725 may be received from the first crossbar array and the second crossbar array, respectively. Vector combination circuit 730 may combine the first output vector 720 and the second output vector 725 into a combined output vector 735, which may represent a combination linear transformation of the first input vector 710 and second input vector 715.

It should be noted that in the examples described in FIG. 4-7, the term "input vector" and "output vector" may refer to a vector of digital or analog values or a plurality of electrical signals mapped from an input or output vector.

The foregoing describes a number of examples for linear transformation accelerators and their applications. It should be understood that the examples described herein may include additional components and that some of the components described herein may be removed or modified without departing from the scope of the examples or their applications. It should also be understood that the components depicted in the figures are not drawn to scale, and thus, the components may have different relative sizes with respect to each other than as shown in the figures.

Further, the sequence of operations described in connection with FIGS. 1-7 are examples and are not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

It should further be noted that, as used in this application and the appended claims, the singular forms "a," "an," and "the" include plural elements unless the context clearly dictates otherwise.

What is claimed is:

1. A linear transformation accelerator, comprising:
   a crossbar array programmed to calculate a linear transformation, the crossbar array comprising a plurality of word lines, a plurality of bit lines, and a memory cell coupled between each unique combination of one word line and one bit line, wherein:
      the memory cells are programmed according to a linear transformation matrix;
      the plurality of word lines are to receive an input vector; and
      the plurality of bit lines are to output an output vector representing a linear transformation of the input vector; and
   a drive circuit to drive input electrical signals representing the input vector to the plurality of bit lines, a switch to direct the input electrical signals to the plurality of word lines or the plurality of bit lines, and a read circuit to receive output electrical signals representing the output vector from the other of the plurality of word lines or the plurality of bit lines.

2. The linear transformation accelerator of claim 1, wherein driving the input electrical signals to the plurality of the bit lines calculates a transpose linear transformation of the input vector.

3. The linear transformation accelerator of claim 2, wherein the driving the input electrical signals to the plurality of the bit lines calculates an inverse linear transformation of the input vector when the matrix is an orthogonal matrix.

4. The linear transformation accelerator of claim 1, further comprising:
   a second crossbar array programmed to calculate a linear transformation and operably coupled to the crossbar array, the second crossbar array comprising a plurality of second word lines, a plurality of second bit lines, and a second memory cell coupled between each unique combination of one second word line and one second bit line, wherein:
      the second memory cells are programmed for a second linear transformation matrix;
      the plurality of second word lines are to receive a second input vector; and
      the plurality of second bit lines are to output a second output vector representing a linear transformation of the second input vector.

5. The linear transformation accelerator of claim 4, further comprising a vector combination circuit to combine the output vector with the second output vector to generate a combined output vector.

6. The linear transformation accelerator of claim 4, wherein the second input vector is the output vector, and the second output vector represents the linear transformation of the second matrix and the output vector.

7. The linear transformation accelerator of claim 1, further comprising a plurality of access transistors, wherein each access transistor is coupled in series with a memory cell of the plurality of memory cells between the unique combinations of one word line and one bit line.

8. The linear transformation accelerator of claim 1, further comprising a plurality of selectors, wherein each selector is coupled in series with a memory cell of the plurality of memory cells between the unique combinations of one word line and one bit line.

9. A linear transformation accelerator, comprising:
   a plurality of operably coupled crossbar arrays, each crossbar array is programmed to calculate a linear transformation and each crossbar array comprising a plurality of word lines, a plurality of bit lines, and a memory cell coupled between each unique combination of one word line and one bit line, wherein:
      the memory cells are programmed according to a linear transformation matrix;
      the plurality of word lines or the plurality of bit lines is to receive an input vector; and
      the other of the plurality of word lines or the plurality of bit lines is to output an output vector representing a linear transformation of the input vector;
   a drive circuit to drive input electrical signals representing the input vector to the plurality of the word lines or the plurality of bit lines of a first crossbar array of the plurality of operably coupled crossbar arrays;

a switch to direct the input electrical signals to the plurality of word lines or the plurality of bit lines of the first crossbar array; and a read circuit to receive output electrical signals representing the output vector from the other of the plurality of word lines or the plurality of bit lines.

10. The linear transformation accelerator of claim 9, further comprising a crossbar and buffer control circuit to control the linear transformation accelerator.

11. The linear transformation accelerator of claim 10, further comprising a vector combination circuit to combine the output vectors of the plurality of operably coupled crossbar arrays to generate a combined output vector.

12. The linear transformation accelerator of claim 10, wherein a second crossbar array of the plurality of operable coupled crossbar arrays is to receive a first output vector of a first crossbar array of the plurality of operable coupled crossbar arrays and to output a second output vector representing a linear transformation of a second matrix and the first output vector, wherein the memristors of the second crossbar array are programmed for the second matrix.

* * * * *